United States Patent [19]

Stuchly et al.

[11] 4,135,152
[45] Jan. 16, 1979

[54] SYSTEM FOR MONITORING AND MEASURING HIGH VOLTAGE D.C. TRANSMISSION LINE CURRENT

[75] Inventors: Stanislaw S. Stuchly, Ottawa; Michael Z. Tarnawecky, Winnipeg; Maurice Yunik, Ile des Chenes, all of Canada

[73] Assignee: Manitoba Research Council, Winnipeg, Canada

[21] Appl. No.: 829,191

[22] Filed: Aug. 30, 1977

Related U.S. Application Data

[63] Continuation of Ser. No. 749,048, Dec. 9, 1976, abandoned.

[51] Int. Cl.² ............... G01R 19/26; G01R 33/00
[52] U.S. Cl. ............... 324/117 R; 324/58 B; 324/95

[58] Field of Search ............. 324/117 R, 127, 58 A, 324/58 B, 95, 250, 126, 96; 333/24.1

[56] References Cited

U.S. PATENT DOCUMENTS

| | | | |
|---|---|---|---|
| 3,001,154 | 9/1961 | Reggia | 333/24.1 |
| 3,675,123 | 7/1972 | Hermstein et al. | 324/96 |

Primary Examiner—Rudolph V. Rolinec
Assistant Examiner—Ernest F. Karlsen
Attorney, Agent, or Firm—Lewis H. Eslinger

[57] ABSTRACT

An yttrium-iron-garnet (YIG) tuned reflection filter is placed in the magnetic field adjacent a High Voltage Direct Current Transmission Line. A YIG filter receives a microwave signal from a remote transmitter and the same signal is modified by the YIG filter and returned to a remote receiver wherein the current in the transmission line is evaluated.

8 Claims, 7 Drawing Figures

FIG. 1(c)

SYSTEM FOR MONITORING AND MEASURING HIGH VOLTAGE D.C. TRANSMISSION LINE CURRENT

This is a continuation of application Ser. No. 749,048, filed Dec. 9, 1976, now abandoned.

This invention relates to the system for measuring the DC current flowing in an electric conductor of a HVDC transmission line, and more particularly to the system for measuring, monitoring or sensing direct electric current by means of a ferromagnetic element capable of tuning an electric filter as a quantitative function of the magnetic field in which it is located. Such elements are hereinafter called ferromagnetic elements.

One such element is a monocrystal Yttrium Iron Garnett (YIG) which has the narrowest ferromagnetic resonance line width known. This, and its linear tuning in a varying DC magnetic field, makes YIG monocrystals ideally suited for tunable electric filters. Such filters are hereinafter called YIG-tuned filters.

The device is especially useful for monitoring the current flow in a HVDC transmission system. The problem arising due to the extra high voltages and large currents in these lines, as well as their relative inaccessibility have not been adequately solved by known conventional measuring techniques.

The present invention envisages the use of a YIG tuned filter adjacent, and influenced by the current therein, a conductor. Since the YIG-tuned filter is a passive device it can be used in both DC and AC systems. A non-passive device is disclosed in U.S. Pat. No. 3,983,477 issued Sept. 28, 1976 and assigned to the present applicant. YIG-tuned filters, in addition to their great magnetic field (and therefore current) sensitivity, are relatively insensitive to ambient temperature changes. Further, that the resonant frequency of the filter, which is a measure of the current in the line, is monitored by a frequency tracking system operating in the microwave frequency range, and is therefore insensitive to radio frequency interference in the power system.

SUMMARY OF THE INVENTION

The objects of the invention are to provide a system of the character herewithin described for measuring HVDC line currents which avoids, as far as possible, all the major drawbacks of the existing system, in particular to provide high accuracy, wide response and with the resulting fast transient response and high fidelity of waveform reproduction, high temperature stability, smaller dimensions and weight.

Another object of the invention is to provide additional information, as compared to that given by the conventional current transducers, and to minimize unnecessary responses or alarms, or to compensate for changing environmental factors that would otherwise prejudice the accuracy of the measuring system.

Another object of the invention is to provide a current measuring system, which avoids as far as possible fluctuation in response, when an HVDC line is vibrating, for example due to wind.

Another object of the invention is to provide a system by means of which the interfering magnetic effect of other nearby current conductors on the monitoring of the wanted conductor can be minimized.

A further object of the invention is to provide a current measuring system which is insensitive to radio frequency interference from an associated power system.

With the foregoing objects in view, and other such objects and advantages as will become apparent to those skilled in the art to which this invention relates as this specification proceeds, our invention consists essentially in the arrangement and construction of parts all as hereinafter more particularly described, reference being to the accompanying drawings in which.

Figure 3:
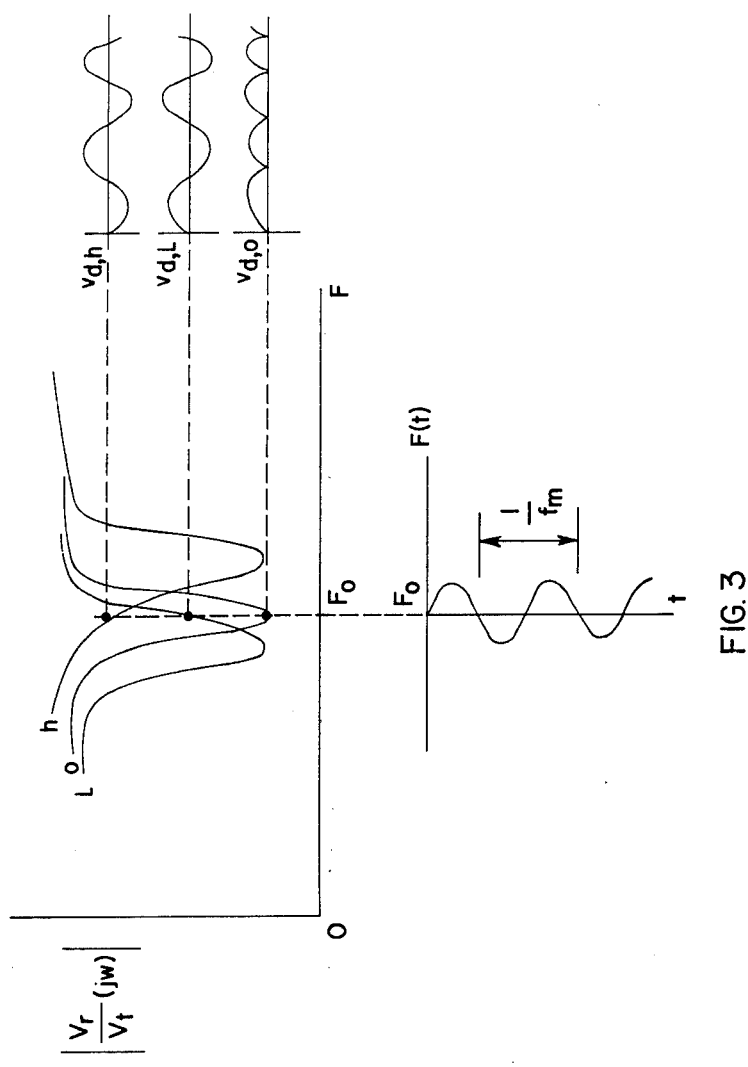

FIG. 3 is a graphical diagram showing qualitatively the reflection coefficient of the YIG filter (defined as a ratio of the reflected signal $v_r$ to the transmitted signal $v_t$) as a function of frequency of the microwave voltage controlled oscillator (71), and, therefore as a function of the measured current. This figure also shows the output signal from the diode detector (72), $v_d$, for three cases of the mutual detuning between the YIG filter (2) and the microwave voltage controlled oscillator (71).

Figure 2:
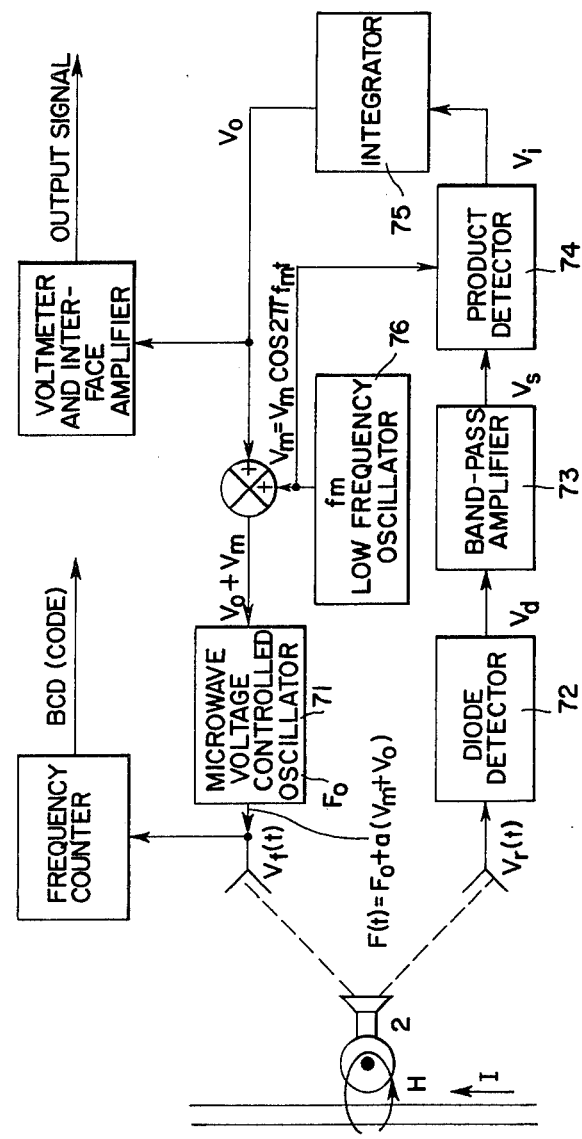
FIG. 2 is a block diagram of the system as a whole.
Figure 4:
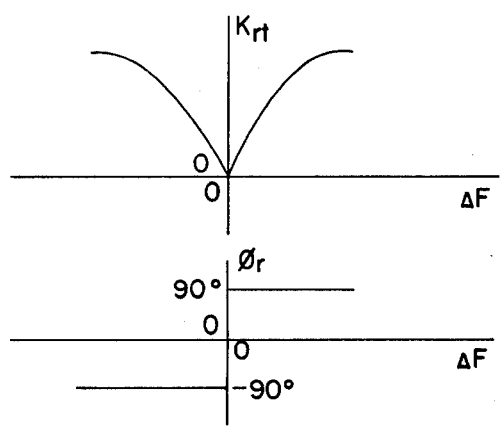
Figure 5:
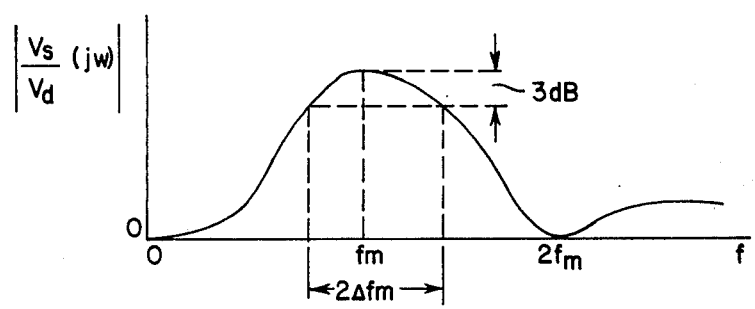
Figure 6:
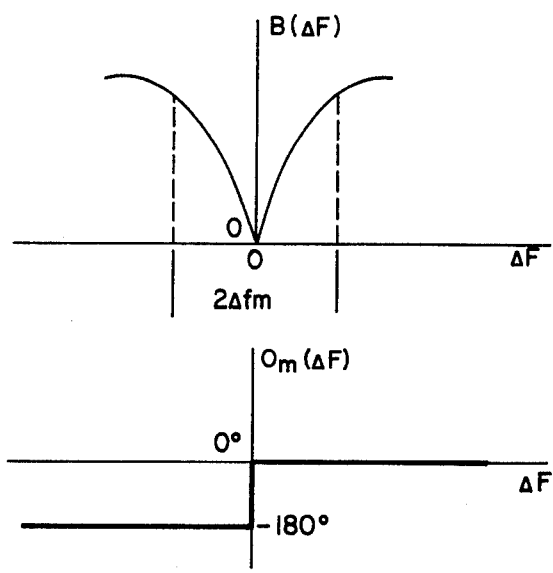
Figure 7:
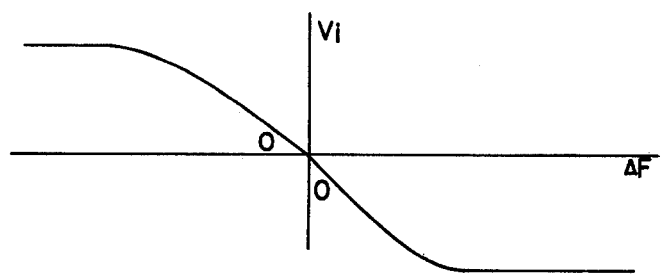

FIG. 4 is a graph showing qualitatively the relationship between the amplitude ($k_{rt}$) and the phase ($\phi_r$) of the microwave signal reflected by the YIG filter ($v_r(t)$ in FIG. 2) as a function of the mutual detuning between the YIG filter (2) and the microwave voltage controlled oscillator (71);

FIG. 5 is a graph illustrating qualitatively the desired frequency response of the band-pass amplifier (73). The 3-dB bandwidth should be $2\Delta f_m$ with a zero response at $2f_m$ to reduce the effect of the second harmonic present at the output of the diode detector (72);

FIG. 6 is a graph illustrating qualitatively the desired frequency characteristic of the product detector (74). The amplitude of the output signal of the product, B ($\Delta f$), should be proportional to the mutual detuning of the YIG filter (2) and the microwave voltage controlled oscillator (71), $\Delta F$. The phase of that signal, $\phi_m (\Delta f)$, should change from 0° to $-180°$ depending on the sign of $\Delta F$; and, FIG. 7 is a graph illustrating qualitatively the desired transfer (input-output) characteristic of the product detector (74).

The invention will now be described with reference to the drawings in which like characters of reference indicate corresponding parts in the different drawings. A High Voltage Direct Current (HVDC) transmission line 1 carries a current I which is to be measured. The current I develops a magnetic field $H_A$ in which a YIG tuned reflection filter 2 is placed. The filter 2 incorporates a fixed biasing magnetic field $H_o$ provided by permanent magnets. The filter is integral with a horn antenna 3 which receives a transmitted signal from a transmitting antenna 5, forming part of a resonant frequency tracking system 7, and reflects a signal to a receiving antenna 6 on the tracking system 7.

Microwave power is generated by a voltage controlled oscillator (VCO) 71 in FIG. 2 within the resonant frequency tracking system (7 in FIG. 1) and is transmitted to the YIG-tuned reflection filter and reflected back to the frequency tracking system. The reflected signal which contains information of the resonant frequency of the filter is detected and after signal processing is used to adjust the VCO to centre frequency $F_o$ of the YIG filter locking the system to this frequency. Since $F_o$ is proportional to the magnetic field acting on the YIG filter, $F_o$ becomes a measure of the current in HVDC transmission line. Mathematically it can be written as $$F_o = \gamma H$$
$$= \gamma (H_o + \alpha I)$$

where H is the magnetic field acting on the YIG filter
$H_o$ is the biasing magnetic field provided by permanent magnets.
I is the current through the HVDC transmission line
$\alpha$ is the proportionality constant relating the current I and the resulting magnetic field due to the current I
$\gamma$ is the gyromagnetic ratio of the YIG filter.

Figures 1A, 1C:
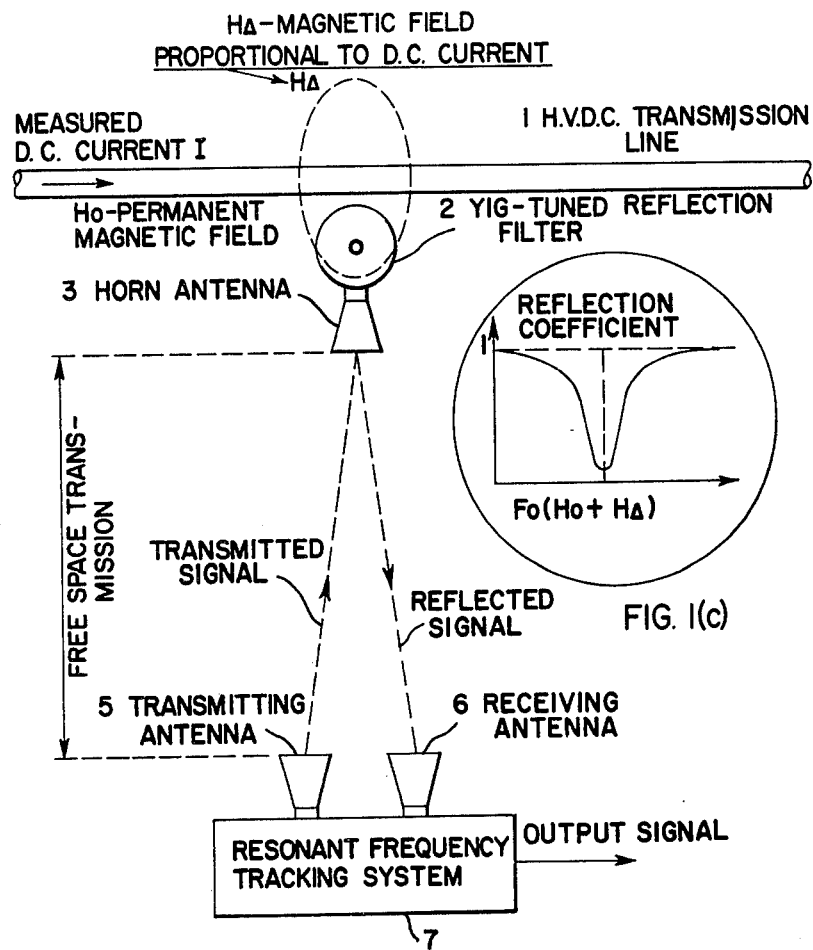
FIG. 1a is a block diagram of the system, using free-space propagation.
FIG. 1c is a graph showing the relationship between the reflection coefficient of the filter and the frequency.

The permanent magnets are used to set $F_o$ to a suitable frequency when the current in the transmission line is zero. FIG. 1c indicates that for zero line current $H\Delta$ is zero; and then $F_o$ is only a function of $H_o$.

The output signal from the resonant frequency tracking system 7 in (FIG. 1) is obtained either by measuring the instantaneous value of $F_o$ or by measuring the driving voltage of the VCO when the tracking system is locked.

Figure 1B:
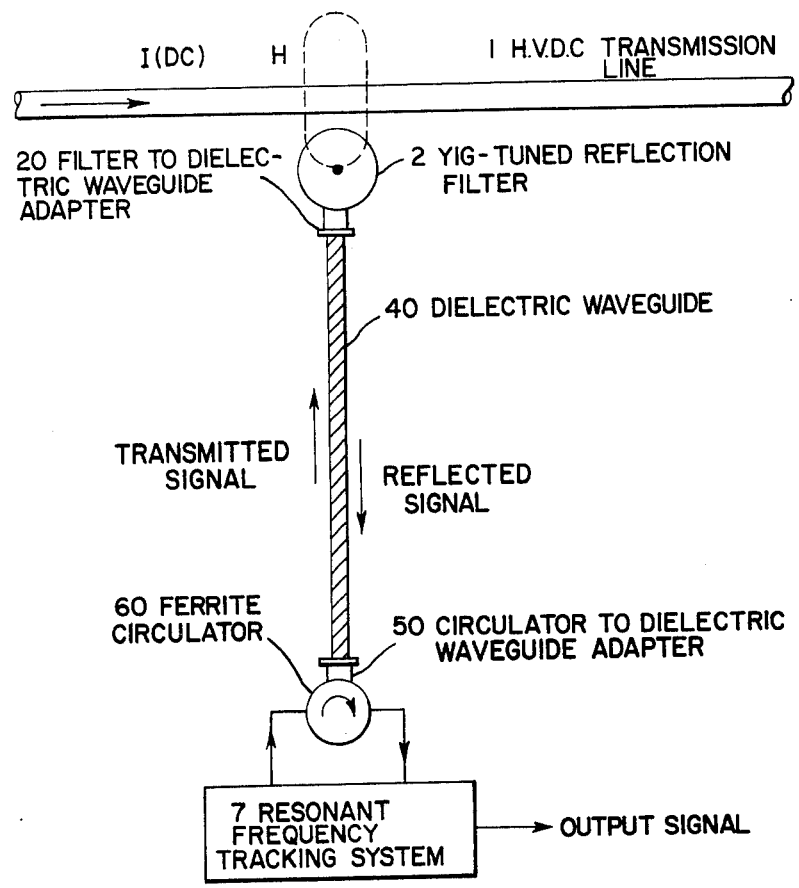
FIG. 1b is a schematic diagram showing propagation between the sensing unit and an associated tracing system using a dielectric waveguide.

In the embodiment shown in FIG. 1a transmission utilizes free space propagation. In FIG. 1b the horn antenna 3 is dispensed with along with transmitting and receiving antennas 5 and 6, and a filter-to-dielectric waveguide adapter 20 is fitted to the YIG-tuned filter 2. A corresponding waveguide adapter 50 is fitted to a ferrite circulator (or waveguide launcher) 60 which serves to simultaneously feed the transmitted signal into a dielectric waveguide 40 and to receive the reflected signal from the same waveguide.

The resonant frequency tracking system 7 will now be described in more detail with reference to FIG. 2.

A microwave voltage controlled oscillator 71 operates in the microwave frequency spectrum and has an output $V_t(t)$ which is fed into the transmitting horn antenna 5, in FIG. 1a, or the ferrite circulator 60 and waveguide adapter 50 in FIG. 1b. The transmitted signal is received by the horn antenna in FIG. 1a or the waveguide adapter in FIG. 1b and the YIG modulated signal $V_r(t)$ is returned to a microwave diode detector 72 whose output signal $V_d$ is fed to a band-pass amplifier 73. The band-pass amplifier has a centre frequency of $f_m$ which is of the order of several megahertz selected for optimum response. The output signal $V_s$ from the band-pass amplifier 73 is fed to a product detector 74, operating at the chosen frequency $f_m$, whose output signal $V_i$ is passed to an electronic integrator 75 having an output signal $V_o$. The electronic integrator circuit 75 reduces the effects of the modulating frequency $f_m$ and allows the overall system to operate nearly as a type 1 control system (with a single integrator within the loop). A low frequency (fixed frequency) oscillator 76 operates at the previously described frequency $f_m$ and has output signal $V_m = V_m \cos 2\pi f_m t$.

The low frequency modulation $f_m$ which is applied to the oscillator 71 together with the integrated voltage $V_o$ sweeps the oscillator output over a range about the centre frequency. FIG. 3 shows three cases h, l and o where the filter centre frequency is above, below and equal to oscillator centre frequency. When the filter frequency is above the oscillator frequency the voltage Vd takes the form Vd,h shown in FIG. 3 and when compared with $V_m$ in the product detector 74 a positive voltage $V_i$ is obtained. This increases the integrator 75 output voltage $V_o$, thus increasing the oscillator frequency.

If the filter frequency is below the oscillator frequency the voltage at the output of detector 72 is Vd,l which is of opposite phase to Vd,h. Thus the voltage $V_i$ will be negative, tending to decrease the oscillator frequency. When the oscillator reaches the centre frequency of the filter, the voltage Vd,o is obtained leading to a value of $V_i$ of zero. This variation of $V_i$ with frequency error is shown in FIG. 7. Thus the control voltage $V_o$ for the oscillator is maintained.

This control voltage $V_o$ is seen to be representative of the oscillator frequency and can be applied to a voltmeter and interface amplifier (FIG. 2) to provide an output signal. Alternatively, the oscillator output can be applied to a frequency counter to produce a binary-coded-decimal (BCD) output.

All of the above discussed circuit blocks in FIG. 2 operate as a closed loop system.

Other embodiments falling within the terms of the appended claims will occur to those skilled in the art.

The embodiments of the invention in which an exclusive property or privilege is claimed are defined as follows:

1. A method for monitoring and measuring the current in a d.c. transmission line, comprising the steps:
    (i) transmitting a microwave signal $v_t$ from a remote location to a monitoring and measuring station on said transmission line,
    (ii) placing a YIG-tuned reflection filter, in the magnetic field H surrounding said line due to said current at said station,
    (iii) receiving said microwave signal $v_t$ at said station and applying said signal to said filter,
    (iv) reflecting back to said location a signal $v_r$ which contains information which is a function of the centre frequency $F_o$ of the filter,
    (v) deriving a signal $v_o$ which is a linear function of the current I in the line.

2. The method of claim 1 wherein the signal $$v_t = V_t \cos (2\pi F(t)t + \phi_t)$$

where $V_t$ is the peak value of the transmitted voltage, $$F_{(t)} = F_o + a(v_m + v_o)$$

where
$F_o$ is the free-running frequency of a voltage controlled oscillator
a is the gain which determines the magnitude of the deviation in F (t) with respect to $F_o$
$v_m$ is the instantaneous voltage obtained from a low frequency oscillator
$v_o$ is an instantaneous voltage component at the output of an intergrator, and
$\phi_t$ is the phase of transmitted signal $v_t$.

3. The method of claim 1 wherein the signal $$v_r = K_{rt} (\Delta F) \cos 2\pi f_m \cdot t + \phi_r(t)$$

where $K_{rt}$ and $\phi_r$ are the amplitude and phase of the reflected signal, $$\Delta F = F_o - F_i$$

where
F$_i$ is the instantaneous YIG filter centre frequency
f$_m$ is a modulation frequency.

4. The method of claim 1 wherein $$F_o = \gamma H$$
$$= \gamma(H_o + \alpha I)$$

where
H is the net magnetic field acting on the YIG filter
H$_o$ is the biasing magnetic field provided by permanent magnets
I is the current through the HVDC transmission line
$\alpha$ is the proportionality constant relating the current I and the resulting magnetic field due to the current I
$\gamma$ is the gyomagnetic ratio of the YIG filter.

5. The method of claim 1 wherein signals $v_t$ and $v_r$ are transmitted through space.

6. The method of claim 1 wherein signals $v_t$ and $v_r$ are transmitted through a dielectric waveguide.

7. Appartus for the remote monitoring and measuring of current in a high voltage direct current transmission line, said apparatus comprising:
(i) a YIG-tuned reflection filter placed at a monitoring and measuring station on said line and influenced by a magnetic field H which is a function of said current, said YIG filter having a centre frequency F$_o$,
(ii) means for generating a microwave signal $v_t$ at said station where $$v_t = V_t \cos(2\pi F(t)t + \phi_t)$$

where V$_t$ is the peak value of said signal $v_t$ $$F_{(t)} = F_o + a(v_m + v_o)$$

F$_o$ is a free-running frequency of a voltage controlled oscillator
a is a gain constant which determines the magnitude of the deviation in F (t) with respect to F$_o$
$v_m$ is an instantaneous voltage obtained from a low frequency oscillator
$v_o$ is an instantaneous voltage component at the output of an integrator, and
$\phi_t$ is the phase of transmitted signal $v_t$,
(iii) means for transmitting said microwave signal $v_t$ from a remote site to said station,
(iv) means for receiving said signal $v_t$ at said station and applying the signal $v_t$ to said YIG-tuned filter,
(v) means for transmitting a microwave signal $v_r$ from said station to said remote site where $$v_r = K_{rt}(\Delta F)\cos 2\pi f_m \cdot t + \phi_r(t)$$

where K$_{rt}$ and $\phi_r$ are the amplitude and phase of a reflected signal $$\Delta F = F_o - F_i$$

where F$_i$ is the instantaneous YIG filter centre frequency
f$_m$ is a modulation frequency
(vi) means for receiving said signal $v_r$ at the remote site,
(vii) means at said remote site for detecting the centre-frequency component F$_o$ of the YIG filter present in the signal $v_t$, and,
(viii) means at said remote site for generating a voltage $v_o$ which is a function $\Delta F$ where $\Delta F = F_o - F_i$ and F$_i$ = the instantaneous YIG centre frequency, and where $\Delta F$ and F$_i$ are both functions of the line current I.

8. Apparatus according to claim 7 wherein the magnetic field acting on the YIG filter is given by:
H = (magnetic field developed by current in said transmission line plus biasing magnetic field provided by permanent magnets).

* * * * *